(12) United States Patent
Kumaresan et al.

(10) Patent No.: US 12,402,249 B2
(45) Date of Patent: Aug. 26, 2025

(54) ECO-FRIENDLY PRINTED CIRCUIT BOARD FOR HIGH TEMPERATURE AND LOW TEMPERATURE APPLICATIONS

(71) Applicant: Sandisk Technologies, Inc., Milpitas, CA (US)

(72) Inventors: Vigneshwarram Kumaresan, Batu Kawan (MY); Vishnu Chandar Janakiraman, Batu Kawan (MY); Mutharasu Devarajan, Milpitas, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 0 days.

(21) Appl. No.: 18/501,619

(22) Filed: Nov. 3, 2023

(65) Prior Publication Data

US 2025/0151193 A1     May 8, 2025

(51) Int. Cl.
| | |
|---|---|
| *H05K 1/03* | (2006.01) |
| *H05K 1/02* | (2006.01) |
| *H05K 3/46* | (2006.01) |

(52) U.S. Cl.
CPC ......... *H05K 1/0366* (2013.01); *H05K 1/0298* (2013.01); *H05K 3/4644* (2013.01)

(58) Field of Classification Search
CPC ... H05K 1/0366; H05K 1/0298; H05K 3/4644
See application file for complete search history.

(56) References Cited

U.S. PATENT DOCUMENTS

| | | | |
|---|---|---|---|
| 2001/0053820 A1 | 12/2001 | Yeager et al. | |
| 2002/0123285 A1 | 9/2002 | Dana et al. | |
| 2020/0413536 A1 * | 12/2020 | Amla | B32B 5/022 |
| 2021/0037645 A1 * | 2/2021 | Levesque | H05K 1/0366 |

FOREIGN PATENT DOCUMENTS

| | | |
|---|---|---|
| CN | 111825955 B | 7/2023 |
| TW | 201945191 A | 12/2019 |
| WO | 2022207532 A1 | 10/2022 |

OTHER PUBLICATIONS

Taiwan Intellectual Property Office, "Office Action," for Taiwan Patent Application No. 113118330, received Jun. 4, 2025.

* cited by examiner

*Primary Examiner* — Laura C Powers
(74) *Attorney, Agent, or Firm* — DENTONS Durham Jones Pinegar

(57) ABSTRACT

A multi-layer printed circuit board (PCB) is fabricated using basalt fibers instead of glass fibers. Using basalt fibers in lieu of glass fibers makes the PCB more environmentally friendly without sacrificing mechanical and electrical properties. The multi-layer PCB includes a basalt fiber core comprised of a basalt fiber prepreg provided between two copper layers. A first copper layer and a second copper are coupled to different sides of the basalt fiber core. A first basalt fiber prepreg is coupled to the first copper layer and a second basalt fiber prepreg is coupled to the second copper layer.

11 Claims, 6 Drawing Sheets

ECO-FRIENDLY PRINTED CIRCUIT BOARD FOR HIGH TEMPERATURE AND LOW TEMPERATURE APPLICATIONS

BACKGROUND

Printed circuit boards (PCBs) come in a variety of different types and are widely used in a number of different electronic devices. One common type of PCB is known as a FR-4 PCB. A FR-4 PCB is made using glass fiber fabric and an epoxy resin. These glass fiber fabric-based PCBs have excellent electrical and mechanical properties, which contributes to the overall reliability and performance of an electronic device.

However, glass fiber fabric-based PCBs have a significant environmental impact due, in part, to the manufacturing processes and the materials that are used for production. For example, the production of glass fiber involves energy-intensive processes, which results in carbon dioxide emissions. Additionally, the raw materials that are used during fabrication, such as silica sand and chemicals, are non-renewable resources. The complex composition of the glass fiber fabric and the epoxy resin also makes recycling and disposal challenging, which leads to the accumulation of electronic waste.

Accordingly, it would be beneficial to reduce the environmental impacts of PCB fabrication by replacing glass fiber fabric with an environmentally friendly material while maintaining or improving the electrical and mechanical properties of the PCB.

SUMMARY

The present application describes a printed circuit board (PCB) that is fabricated using naturally occurring materials instead of glass fibers or a glass fiber fabric. In an example, the naturally occurring material is basalt fiber that is derived from volcanic rock. The basalt fibers are used to produce basalt fiber fabric. Because basalt fiber is derived from naturally occurring volcanic rock, basalt fibers (and basalt fiber fabric) is more sustainable and environmentally friendly when compared to glass fiber.

Additionally, production of basalt fiber requires less energy and emits fewer greenhouse gases when compared to the production of glass fiber. When compared to glass fiber, basalt fiber is more easily recycled and reused, which reduces waste. Basalt fiber also has better mechanical properties and has a higher electrical insulation when compared to the mechanical properties and electrical insulation of glass fiber.

Additionally, basalt fibers are inert, have a high temperature resistance and a high corrosion resistance. Basalt fibers also have excellent thermal properties with a melting temperature between 1500° C. and 1700° C. As such, basalt fibers can easily withstand temperatures between 1100° C. and 1200° C. without any physical damage. Basalt fibers can also be used as a heat-resistant insulating material during the PCB fabrication process.

Accordingly, examples of the present disclosure describe a PCB that includes a basalt fiber core. In an example, the basalt fiber core includes a first prepreg comprised of a basalt fiber fabric and epoxy resin. The basalt fiber core also includes a first copper layer coupled to a first surface of the first prepreg and a second copper layer coupled to a second surface of the first prepreg. The PCB also includes a third copper layer coupled to the first copper layer and a fourth copper layer coupled to the second copper layer. A second prepreg is coupled to the third copper layer and a third prepreg is coupled to the fourth copper layer. In an example, the second prepreg and third prepreg are also comprised of basalt fiber fabric and epoxy resin.

Examples also describe a method of fabricating a basalt fiber prepreg for a PCB. In an example, the basalt fiber prepreg is fabricated by drying a basalt fiber fabric and impregnating the basalt fiber fabric with an epoxy resin. The basalt fiber fabric and the epoxy resin is compression cured. The basalt fiber fabric and the epoxy resin is then cooled and compressed simultaneously.

A method of fabricating a basalt fiber core for a PCB is also described. The method includes drying a basalt fiber prepreg and subsequently impregnating the basalt fiber prepreg with an epoxy resin. A first copper layer is attached to a first side of the basalt fiber prepreg and second copper layer attached to a second side of the basalt fiber prepreg. The basalt fiber prepreg, the first copper layer and the second copper layer then undergo a compression curing process. Upon completion of the compression curing process, the basalt fiber prepreg, the first copper layer, and the second copper layer are cooled and compressed simultaneously.

In yet another example, a method of fabricating a PCB is disclosed. In an example, the method includes immersing a first prepreg in epoxy resin. In an example, the first prepreg includes a basalt fiber fabric and an epoxy resin. The first prepreg is then placed on a first copper layer. A second copper layer is then placed on a top surface of the first prepreg. A basalt fiber core is placed on the second copper layer. In an example, the basalt fiber core comprises a basalt fiber prepreg and two copper layers. A third copper layer is placed on a top surface of the basalt fiber core. A second prepreg is also immersed in the epoxy resin and subsequently placed on a top surface of the third copper layer. In an example, the second prepreg includes a basalt fiber fabric and an epoxy resin. A fourth copper layer is then placed on a top surface of the second prepreg. The basalt fiber core, the first prepreg, the second prepreg, the first copper layer, the second copper layer, the third copper layer and the fourth copper layer are then compressed to form the PCB.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

Figure 1:
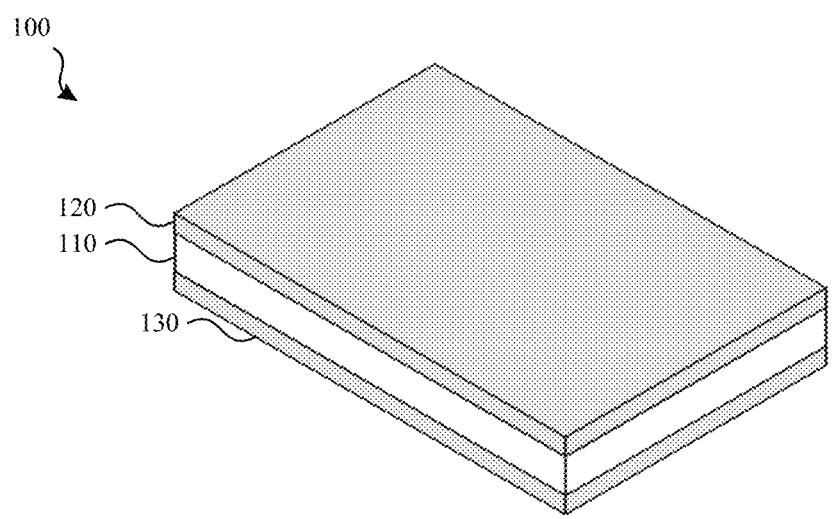
FIG. 1 illustrates a basalt fiber core for a PCB according to an example.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. The following detailed description is therefore not to be taken in a limiting sense, and the scope of the present disclosure is defined by the appended claims and their equivalents.

Glass fiber fabric-based printed circuit boards (PCBs), also known as FR4 PCBs, are typically used in a variety of different electronic devices. Glass fiber fabric-based PCBs have excellent electrical and mechanical properties, which contributes to the overall reliability and performance of an electronic device.

However, glass fiber fabric-based PCBs have a significant environmental impact due to the manufacturing processes and the materials used to fabricate the PCBs. For example, the production of glass fibers involve energy-intensive processes. Additionally, the raw materials (e.g., silica sand, chemicals) that are used to create glass fibers are non-renewable resources. The manufacturing process also emits large amounts of carbon dioxide.

In addition to the drawbacks listed above, glass fiber fabric-based PCBs generate waste during end-of-life disposal. For example, due to the complex composition of glass fiber and epoxy resin, it is challenging to recycle and/or properly dispose of the glass fiber fabric-based PCBs which, leads to the accumulation of electronic waste.

In order to address the above, the present application describes a PCB that is fabricated using naturally occurring materials. In an example, the naturally occurring material is basalt fiber that is derived from naturally occurring volcanic rock. The basalt fibers may then be used to make basalt fiber fabric. Because basalt fibers are derived from a naturally occurring material, the basalt fibers are more sustainable and environmentally friendly when compared to glass fiber. Additionally, basalt fiber is stable, inert, sustainable, and non-reactive.

Other advantages of using basalt fibers in lieu of glass fibers are that basalt fibers have high mech-physicochemical properties, basalt fibers are biodegradable, are easy to recycle, produce no chemical reactions, have no toxic reactions with air and/or water, and basalt fibers have non-abrasive qualities. Additionally, basalt fibers have better mechanical properties when compared with glass fibers, have a high-temperature resistance and a high corrosion resistance.

In addition to the environmental benefits of using basalt fibers when fabricating PCBs, basalt fiber fabric-based PCBs provide many technical benefits including, but not limited to, causing the PCB to be more resistant to breakage, bending and other mechanical stresses. Basalt fiber fabric-based PCBs also have a low dielectric constant variation with frequency, temperature, and moisture content, which helps maintain signal integrity and reduces the risk of signal distortion or loss. Basalt fibers have better radio frequency (RF) shielding and electromagnetic interference (EMI) protection when compared to glass fibers. Additionally, basalt fiber fabric-based PCBs can effectively block or attenuate RF signals, which minimizes interference and ensures reliable performance of sensitive electronic components. Basalt fibers also exhibit good resistance to chemicals and corrosive environments which enables basalt fiber fabric based-PCBs to withstand exposure to various substances. Basalt fiber fabrics are also more easily formed into complex shapes when compared with glass fiber fabrics. As such, basalt fiber fabrics allow for greater design flexibility in PCB manufacturing. As such, customized and intricate PCB layouts may be designed and created based on specific application requirements.

These and other examples will be shown and described in greater detail with respect to FIG. 1-FIG. 6.

FIG. 1 illustrates a basalt fiber core 100 for a PCB according to an example. As previously explained, due to the excellent thermal properties of basalt fibers, the basalt fiber core 100 may be used in low temperature applications as well as high temperature applications.

In an example, the basalt fiber core 100 includes a basalt fiber prepreg 110, a first copper layer 120 and a second copper layer 130. The basalt fiber prepreg 110 is comprised of a basalt fiber fabric and an epoxy resin. In an example, the basalt fiber fabric is made from basalt fibers. The basalt fiber fabric may have a number of different configurations or weaves. For example, the basalt fiber fabric may have a plain weave pattern, a twill weave pattern, a biaxial weave pattern a tri-axial weave pattern and so on. Additionally, in an example, a basalt fiber prepreg may include a single layer of basalt fiber fabric or multiple layers of basalt fiber fabric. In an example, glass fibers are not used in either the creation of the basalt fiber core 100 and/or a basalt fiber fabric-based PCB of which the basalt core 100 will be a part.

In an example, during fabrication of the basalt fiber core 100, the basalt fiber prepreg is impregnated with the epoxy resin. The first copper layer 120 and the second copper layer 130 are coupled to first and second surfaces of the basalt fiber prepreg 110. As will be explained in greater detail below with respect to FIG. 5, the copper layers and the basalt fiber prepreg are compression cured and subsequently cooled. The basalt fiber core 100 may then be used to fabricate a basalt fiber fabric-based PCB.

Figure 2:
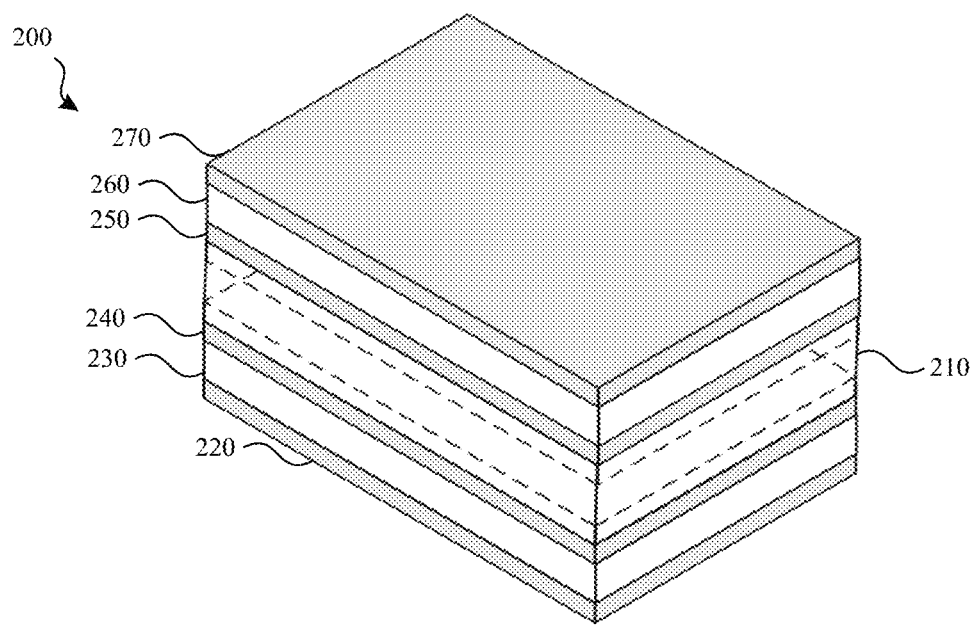
FIG. 2 illustrates a basalt fiber fabric-based PCB according to an example.

FIG. 2 illustrates a basalt fiber fabric-based PCB 200 according to an example. The basalt fiber fabric-based PCB 200 includes a basalt fiber core 210 and a number of basalt fiber prepregs. In an example, the basalt fiber core 210 is similar to the basalt fiber core 100 shown and described with respect to FIG. 1. As such, the basalt fiber core 210 includes a basalt fiber prepreg (e.g., the basalt fiber prepreg 110 (FIG. 1)) sandwiched or provided between two copper layers (e.g., the first copper layer 120 and the second copper layer 130 (FIG. 1)).

In the example shown, the basalt fiber fabric-based PCB 200 is a four layer PCB. Although four layers are shown, the basalt fiber fabric-based PCB 200 may include any number of layers. Additionally, each of the layers may be formed using the various processes described herein.

In an example, the basalt fiber fabric-based PCB 200 includes a first copper layer 220, a first basalt fiber prepreg 230 and a second copper layer 240. The first copper layer 220 is adhered, attached or otherwise coupled to a bottom surface of the first basalt fiber prepreg 230. Likewise, the second copper layer 240 is adhered, attached or otherwise coupled to a top surface of the first basalt fiber prepreg 230.

The basalt fiber core 210 is adhered, attached or otherwise coupled to a top surface of the second copper layer 240. For example, a bottom surface of the second copper layer (e.g., the second copper layer 130 (FIG. 1)) of the basalt fiber core 210 is coupled to a top surface of the second copper layer 240.

Additionally, a third copper layer 250 is adhered, attached or otherwise coupled to a top surface of the basalt fiber core 210. For example, a top surface of the first copper layer (e.g., the first copper layer 120 (FIG. 1)) of the basalt fiber core 210 is coupled to a bottom surface of the third copper layer 250. In an example, the basalt fiber fabric-based PCB 200 also includes a second basalt fiber prepreg 260 that is adhered, attached or otherwise coupled to a top surface of the third copper layer 250. A fourth copper layer 270 is also adhered, attached or otherwise coupled to a top surface of the second basalt fiber prepreg 260.

In an example, the basalt fiber fabric-based PCB 200 offers numerous environmental advantages over glass fiber fabric-based PCBs. For example and as previously explained, basalt fibers are derived from volcanic rock which is a natural and an abundant resource. Additionally, the production of basalt fibers and basalt fiber fabric requires less energy when compared to the production of glass fibers and glass fiber fabric, which results in a lower environmental impact during manufacturing. The production of basalt fibers emits less carbon dioxide when compared to glass fibers.

Because basalt is a naturally occurring rock, its conversion into fibers requires lower temperatures when compared to glass fiber conversion, which reduces energy consumption and associated carbon dioxide emissions. Basalt fiber fabric is also more eco-friendly in terms of waste generation. Basalt fibers are also naturally resistant to moisture and degradation which leads to longer product lifecycles. Additionally, basalt fiber-based materials can be recycled and reused more easily than glass fiber-based materials.

In addition to the various environmental benefits, basalt fiber fabric-based PCBs have similar, and in some cases, better physical, mechanical, thermal and electrical properties when compared with glass fiber fabric-based PCBs. To illustrate, a four layer glass fiber fabric-based PCB and a four layer basalt fiber fabric-based were developed under the same conditions, and using the same epoxy resin. Table 1 shows physical, mechanical, thermal and electrical properties of the four layer glass fiber fabric-based PCB compared with the same physical, mechanical, thermal and electrical properties of the four layer basalt fiber fabric-based PCB 200. A detailed explanation of Table 1 follows.

TABLE 1

| PROPERTIES | | GLASS FIBER PCB | BASALT FIBER PCB |
|---|---|---|---|
| PHYSICAL | Density (g/cm³) | 1.5-1.8 | 1.9-2.3 |
| MECHANICAL | Young's Modulus (GPa) | 1.3-3.5 | 6.0-9.0 |
| | Tensile Strength (MPa) | 30-50 | 130-175 |
| THERMAL | CTE, X Axis (ppm/° C.) | 14-18 | 12-18 |
| | CTE, Y Axis (ppm/° C.) | 14-18 | 15-19 |
| | Tg (° C.) | 165-170 | 166-172 |
| | Thermal Conductivity (W/m · K) | 2.5-3.1 | 2.5-3.2 |
| | Thermal Degradation 1% Wt Loss (° C.) | 210-220 | 205-220 |
| ELECTRICAL | Dk     1 GHZ | 4.5-5.5 | 4.7-5.8 |
| | Df     1 GHZ | 0.015-0.025 | 0.015-0.030 |

The density of a PCB is an important factor to consider during the design and manufacturing stages of the PCB, as the density can impact signal integrity. For example, a higher density may reduce the amount of electromagnetic interference and signal crosstalk, which leads to better performance and reliability. Additional factors that affect the density of the PCB may include the number of layers in the PCB, a thickness of copper traces and type of material from which the PCB is manufactured.

As shown in Table 1, the basalt fiber fabric-based PCB 200 has a higher density when compared to the glass fiber fabric-based PCB. For example, the basalt fiber fabric-based PCB 200 has a density between 1.9 grams per cubic centimeter (g/cm³) and 2.3 g/cm³. In comparison, the glass fiber fabric-based PCB has a density between 1.5 g/cm³ and 1.8 g/cm³.

Table 1 also shows that the basalt fiber fabric-based PCB 200 has a higher modulus of elasticity when compared to the glass fiber fabric-based PCB. High modulus materials have a higher resistance to deformation under stress compared to lower modulus materials. Thus, the higher the modulus, the more structurally stable the PCB will be. As such, the PCB will not deform or excessively bend under the weight of components, during handling, or when exposed to vibrations or mechanical stress. High modulus materials also helps maintain the dimensional stability of the PCB, which is crucial for the reliable functioning of the various electronic components that are mounted on, or are otherwise associated with, the PCB.

For example, the modulus of elasticity of the basalt fiber fabric-based PCB 200 is between 6.0 gigapascals (GPa) to 9.0 GPa, whereas the glass fiber fabric-based PCB has a modulus of elasticity between 1.0 GPa and 3.5 GPa. Additionally, a tensile strength of the basalt fiber fabric-based PCB 200 is between 130 megapascals (MPa) and 175 MPa while the tensile strength of the glass fiber fabric-based PCB is between 30 MPa and 50 MPa.

A coefficient of thermal expansion (CTE) is a property that indicates the extent at which a material expands when heated. During temperature fluctuations, solder joints on a PCB expand and contract. If the CTE of the PCB does not match the CTE of the solder joints and/or the CTE of the various components on the PCB, it can lead to mechanical stress on the solder joints. This may cause solder fatigue and eventually solder joint failure.

As shown in Table 1, an X axis CTE of the glass fiber fabric-based PCB is between 14 parts per million per degree Celsius (ppm/° C.) and 18 ppm/° C. and a Y axis CTE of the glass fiber fabric-based PCB is between 14 ppm/° C. and 18 ppm/° C. The X axis CTE of the basalt fiber fabric-based PCB 200 is between 12 ppm/° C. and 18 ppm/° C. while the Y axis CTE of the basalt fiber fabric-based PCB 200 is between 15 ppm/° C. and 19 ppm/° C. Thus, the CTE of the basalt fiber fabric-based PCB 200 is comparable to the CTE of the glass fiber fabric-based PCB.

Thermal conductivity is an essential characteristic of PCBs. Thermal conductivity is an ability of the PCB to effectively and efficiently dissipate heat generated by active components (e.g., processors, transistors, power elements) on the PCB. Heat dissipation prevents overheating, which can lead to performance issues, premature component failure, or even fire hazards. Thermal conductivity is primarily influenced by the materials used in the core and prepreg layers.

As shown in Table 1, the thermal conductivity of the glass fiber fabric-based PCB is between 2.5 watts per meter per Kelvin (W/m·K) and 3.1 W/m·K. The thermal conductivity of the basalt fiber fabric-based PCB 200 is between 2.5 W/m·K and 3.2 W/m·K. As these values are substantially similar, replacing glass fiber with basalt fiber will not create any thermal and/or reliability issues for a PCB.

Table 1 also shows that when a temperature surpasses a glass transition temperature (Tg) threshold, the CTE of the glass fiber fabric-based PCB and the CTE of the basalt fiber fabric-based PCB 200 are substantially similar. For example, the Tg of the glass fiber fabric-based PCB is between 165° C. and 170° C. while the Tg of the basalt fiber fabric-based PCB 200 is between 166° C. and 172° C. When the Tg of a material is over 170° C., it is referred to as a high Tg material. As the Tg of the material increases, the heat resistance, moisture resistance, chemical resistance and stability of the material is enhanced. Additionally, the thermal degradation temperature of the glass fiber fabric-based PCB and the thermal degradation temperature of the basalt fiber fabric-based PCB 200 are substantially similar. For example, the thermal degradation temperature at 1% weight loss of basalt fiber fabric-based PCB 200 is between 205° C. and 220° C. while the thermal degradation temperature at 1% weight loss of glass fiber fabric-based PCB 200 is between 210° C. and 220° C. Thus, the higher Tg value & thermal degradation temperature, the better temperature resistance of the material. Also, basalt fiber is a high temperature resistant material, basalt fiber can be used for high temperature applications.

Two of the most important factors that determine the electrical performance of a dielectric constant are impedance and signal integrity. A speed of electrical signal propagation in a PCB material is governed by its dielectric constant. The higher the dielectric constant, the slower the signal speed and the lower the dielectric constant, the faster the signal speed. Thus, PCB materials with a low dielectric constant work more efficiently.

Typically, the dielectric constant, or a relative permittivity, of a PCB material is between 3.5 and 5.5. As shown in Table 1, the dielectric constant (Dk) of the glass fiber fabric-based PCB at 1 gigahertz (GHZ) is between 4.5 and 5.5 while the dielectric constant of the basalt fiber fabric-based PCB 200 at 1 GHZ is between 4.7 and 5.8. As such, the dielectric constant of the basalt fiber fabric-based PCB 200 is well within the expected dielectric constant range.

A material loses less power if its loss tangent is low. Normally, the dielectric loss tangent (Tan δ) of materials used in a PCB is in the range of 0.02 to 0.001. As shown in Table 1, the dielectric loss tangent (Df) of the basalt fiber fabric-based PCB 200 is between 0.015 and 0.030 and the dielectric loss tangent of the glass fiber fabric-based PCB is between 0.015 and 0.025. This indicates good signal integrity in the basalt fiber fabric-based PCB 200. Additionally, because there is no major deviation in Dk and Df values between the basalt fiber fabric-based PCB 200 GF and the glass fiber fabric-based PCB, the basalt fiber fabric-based PCB may be used in lieu of a glass fiber fabric-based PCB.

Figure 3:
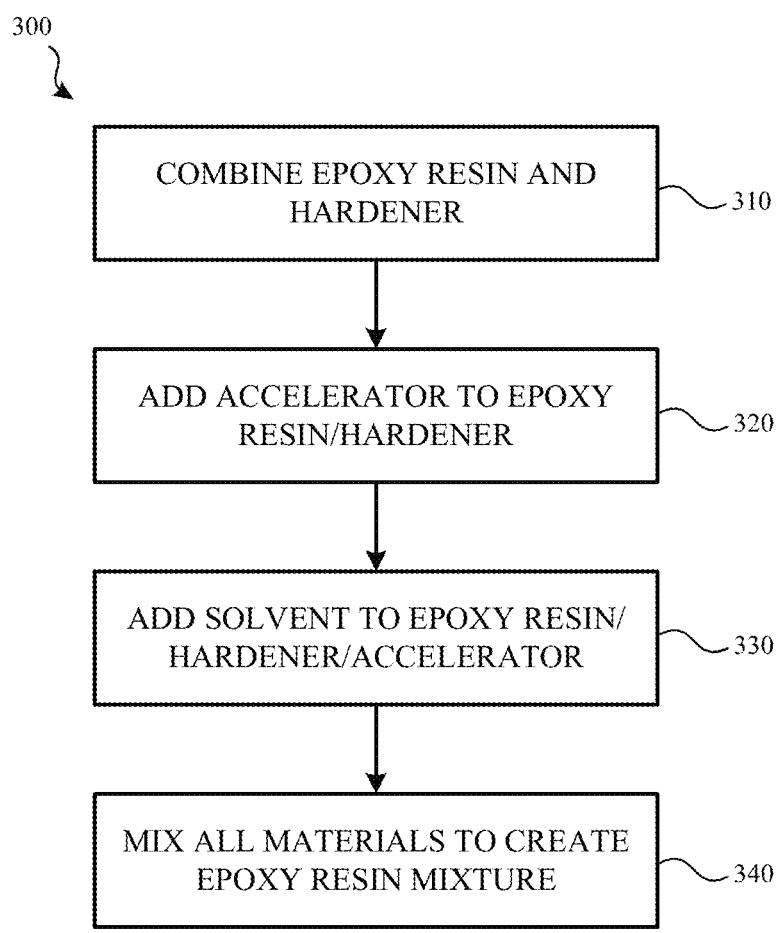
FIG. 3 illustrates a method for preparing an epoxy resin mixture according to an example.

FIG. 3 illustrates a method 300 for preparing an epoxy resin mixture according to an example. In an example, the epoxy resin mixture is combined with basalt fibers or a basalt fiber fabric to produce, fabricate or manufacture a basalt fiber prepreg and/or a basalt fiber core, such as, for example, the basalt fiber core 100 shown and described with respect to FIG. 1. Additionally, the epoxy resin mixture may be used to fabricate a multi-layer PCB such as, for example the basalt fiber fabric-based PCB 200 shown an described with respect to FIG. 2.

Method 300 begins when an epoxy resin is combined (310) with a hardener. For example, between 28 gm to 55 gm of solid epoxy resin (e.g., HP6000 or other naphthalene-based epoxy resin) is mixed with between 22 gm to 45 gm of a phenol-based hardener, based on 1.22:1 ratio. In an example, phenol-based hardeners are used in combination with a naphthalene-based epoxy resins due to their compatibility. For example, the combination of phenol-based hardeners and naphthalene-based epoxy resin helps ensure a strong cross-linking reaction and network structure that provides specific properties to the cured epoxy resin. When these materials are combined, they provide a cured epoxy system with excellent thermal stability, which helps ensure the material is suitable for high-temperature applications. Additionally, when compared with other resins and hardeners, these materials may provide improved mechanical properties, such as increased rigidity and tensile strength.

Although specific weights and ratios of epoxy resin to a hardener are mentioned, an epoxy resin mixture may be mixed with a hardener using a ratio between 0.9 and 1.4 (epoxy resin) to between 0.8 and 1.2 (hardener). Additionally and although solid epoxy resin is specifically mentioned, it is contemplated that the epoxy resin may be any type of epoxy resin including, but not limited to, solid epoxy resin, liquid epoxy resin, single part, two-part, epoxy resin with all types of fillers, epoxy resin with high Tg and epoxy resin with low Tg. Additionally, although a phenol-based hardener is specifically mentioned, an amine-based hardener, or other types of hardeners, may be used. When the epoxy resin and the hardener have been combined, an accelerator is added (320) to the mixture. In an example, the accelerator is 2-Ethyl-4-methylimidazole (EMI24). EMI24 is an effective curing agent as well as an accelerator. EMI24 promotes a high degree of crosslinking, accelerates a polymerization reaction, and provides a fast cure rate, which reduces an overall cure time when compared with other accelerators. While EM124 is specifically mentioned, other accelerators (e.g., triphenylphosphine or an imidazole-based accelerator) may be used. The amount of accelerator that is added is between 1 gm-5 gm. The accelerator is used to accelerate the curing time of the epoxy resin.

A solvent is then added (330) to the epoxy resin, the hardener, and the accelerator mixture. In an example, an amount of solvent that is added to the mixture is between 50 gm and 70 gm. All of the materials are then mixed (340) to create an epoxy resin mixture.

In an example, the solvent is methyl ethyl ketone (MEK). Although MEK is specifically mentioned, other solvents (e.g., toluene, methyl cellosolve, acetone, methoxy propanol) may be used. In an example, MEK is used because it has a moderate evaporation rate and boiling point when compared with other solvents. For example, when comparing MEK with acetone, acetone evaporates more quickly, which could considerably shorten the working time when mixing and applying the epoxy resin to the basalt fiber fabric or basalt fiber prepreg. In contrast, MEK doesn't evaporate as quickly as acetone which helps ensure a desired viscosity of the epoxy resin mixture is maintained throughout a mixing and coating process (described below). Additionally, MEK has excellent solubility with resin and helps ensures a consistent and homogeneous mixture.

When comparing MEK with other solvents that have a slower evaporation rate (e.g., toluene, methyl cellosolve), the slower evaporation rate may not be as efficient during a compression curing process (described below). With its moderate evaporation rate and boiling point, MEK can evaporate during a time frame specified by the compression curing process.

In an example, the materials are mixed homogeneously using magnetic stirrer under different RPM conditions (e.g., 450 RPM-1200 RPM) for about between 10 minutes and 15 minutes. Although a specific amount of time is specified, the materials are mixed until the solid epoxy resin has completely dissolved and turned into a liquid form.

In an example, any type of epoxy resin, hardener, accelerator, solvent that is used in the PCB industry can be used to create the epoxy resin mixture for basalt fiber fabric-based PCBs. Table 2 includes the materials for the epoxy resin mixture in terms of the ratio (R) and the weight (W).

TABLE 2

| CHEMICAL(S) | RATIO (R) AND WEIGHT (W) |
|---|---|
| Epoxy Resin | 0.9-1.4 (R) |
| Hardener | 0.8-1.2 (R) |
| Accelerator | 1-5 gm (W) |
| Solvent | 50-70 gm (W) |

Figure 4:
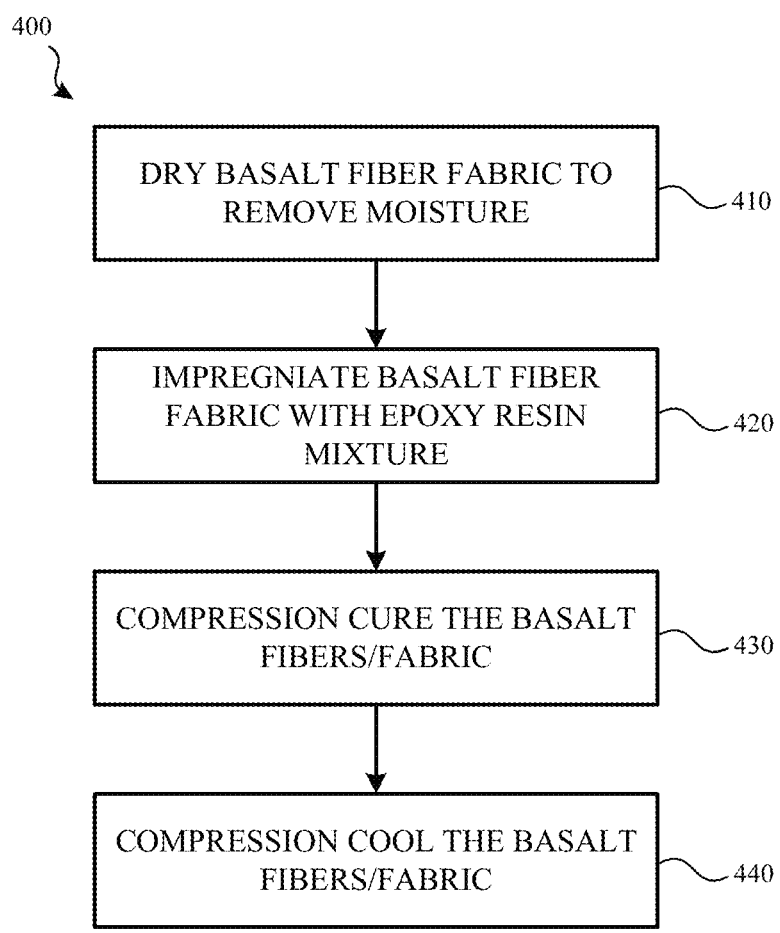
FIG. 4 illustrates a method for fabricating a basalt fiber prepreg according to an example.

FIG. 4 illustrates a method 400 for fabricating a basalt fiber prepreg according to an example. In an example, the method 400 may be used to fabricate, create or otherwise manufacture a basalt fiber prepreg that may be used as part of a basalt fiber core (e.g., the basalt fiber core 100 (FIG. 1)) and/or a basalt fiber fabric-based PCB (e.g., the basalt fiber fabric-based PCB 200 (FIG. 2)). Additionally, and in an example, the method 400 may occur after an epoxy resin mixture has been prepared (e.g., after the method 300 (FIG. 3) has been performed).

Method 400 begins when a basalt fiber fabric (comprised of basalt fibers) is dried (410) or otherwise undergoes a drying process. The drying process is used to remove any moisture that may be contained within the basalt fiber fabric. In an example, the drying process includes placing the basalt fiber fabric in a drying oven (or other drying/heating device) and drying/heating the basalt fibers at a particular temperature for a period of time. Although a drying oven is specifically mentioned, the basalt fiber fabric may be dried by oven drying, hot-air drying, hot air with directional assist drying, and/or short wave drying or combinations thereof. In an example, the basalt fiber fabric is dried between thirty minutes to one hour at a temperature between 70° C. to 100° C.

Upon completion of the drying process, the basalt fiber fabric is impregnated (420) with an epoxy resin. In an example, the basalt fiber fabric is impregnated with the epoxy resin using one or more of dip coating, air spray coating, airless sprayer coating, slot-die coating, immersion, ultrasonic coating, three-dimensional printing, roller coating, paint brush, electrostatic spraying, or a high volume low pressure (HVLP) spray. In an example, the basalt fiber fabric is impregnated with the epoxy resin mixture that was produced using the method 300 shown and described with respect to FIG. 3.

Upon removal of the basalt fibers from the epoxy resin mixture, the basalt fibers are compression cured (430) using a compression curing process. In an example, the basalt fibers and the epoxy resin are compression cured at a temperature between 170° C. and 175° C. and at a pressure between 1 MPa and 10 MPa for between three minutes and five minutes. In an example, an oven and/or hot press equipment are used for the compression curing process. The compression curing process helps ensure that the epoxy resin is uniformly distributed across the basalt fiber fabric.

The basalt fiber fabric and epoxy resin is cooled while being simultaneously compressed (440). In an example, the basalt fiber fabric is cooled with water and is compressed at a pressure between 1 MPa and 10 MPa for between three minutes and five minutes. Upon completion of the compression cooling process, the basalt fiber prepreg has been fabricated/manufactured.

Figure 5:
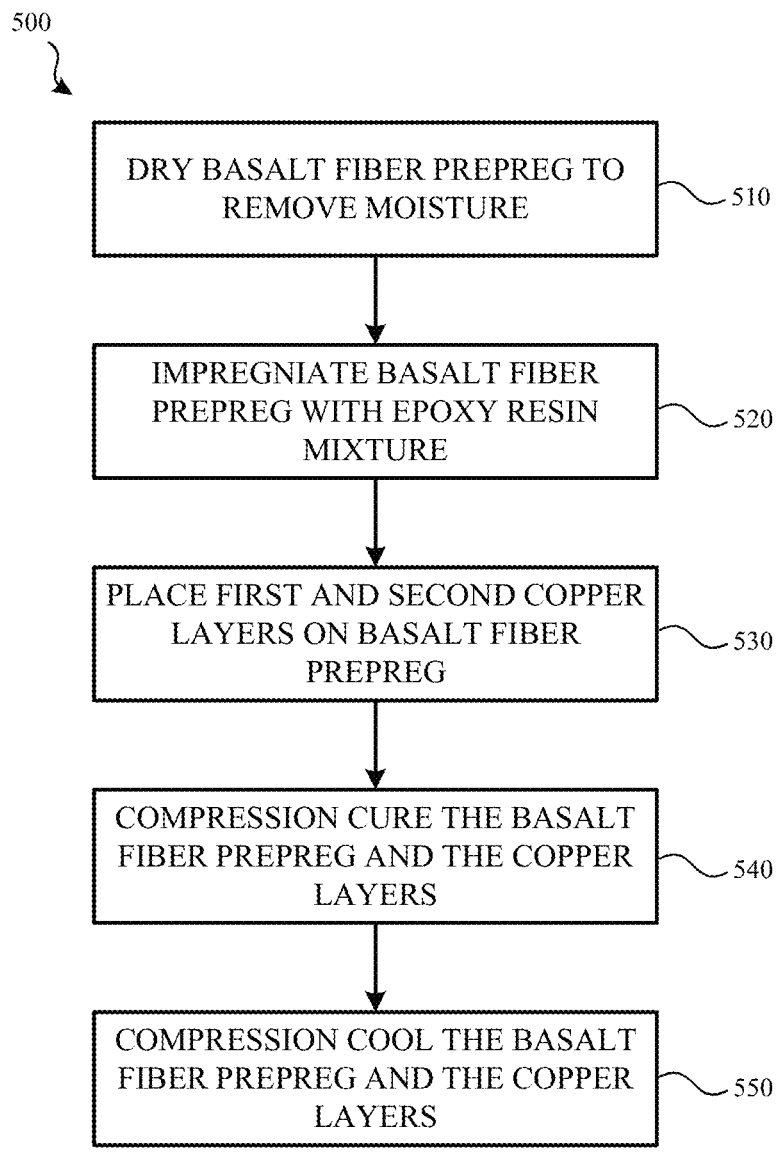
FIG. 5 illustrates a method for fabricating a basalt fiber core for a printed circuit board according to an example.

FIG. 5 illustrates a method 500 for fabricating a basalt fiber core for a PCB according to an example. In an example, the method 500 may be used to fabricate the basalt fiber core 100 shown and described with respect to FIG. 1. Additionally, the epoxy resin that used in method 500 may be the epoxy resin mixture that was produced using the method 300 shown and described with respect to FIG. 3. In another example, the basalt fiber prepreg that is used as part of the basalt fiber core may be fabricated using the method 400 shown and described with respect to FIG. 4.

Method 500 begins when a fabricated basalt fiber prepreg is dried (510) to remove any moisture. In an example, the drying process includes, but is not limited to, oven drying, hot-air drying, hot air with directional assist drying, and/or short wave drying or combinations thereof. The basalt fiber prepreg is dried at a particular temperature for a particular period of time. In an example, the basalt fiber prepreg is dried between thirty minutes to one hour at a temperature between 70° C. to 100° C.

Upon completion of the drying process, the basalt fiber prepreg is impregnated (520) with an epoxy resin. In an example, impregnating the basalt fiber prepreg with the epoxy resin includes, but is not limited to, one or more of the following, dip coating, air spray coating, airless sprayer coating, slot-die coating, immersion, ultrasonic coating, three-dimensional printing, roller coating, paint brush, electrostatic spraying, and high-volume low pressure (HVLP) spray. In an example, the basalt fiber prepreg is impregnated with the epoxy resin mixture that was produced using the method 300 shown and described with respect to FIG. 3. Impregnating the basalt fiber prepreg with the epoxy resin helps adhere, attach, bond or otherwise secure copper layers to the basalt fiber prepreg.

Upon removal of the basalt fiber prepreg from the epoxy resin mixture, a first copper layer is placed (530) on a first surface of the basalt fiber prepreg and a second copper layer is placed on a second surface of the basalt fiber prepreg. The basalt fiber prepreg and the copper layers are compression cured (540) using a compression curing process.

In an example, the basalt fiber prepreg and the copper layers are compression cured at a temperature between 170° C. and 175° C., at a pressure between 1 MPa and 10 MPa for between three minutes and five minutes. In an example, an oven and/or hot press equipment are used for the compression curing process.

The basalt fiber prepreg and the copper layers are cooled and compressed (550) using a compression cooling process. In an example, the basalt fiber prepreg and copper layers are cooled with water and are compressed at a pressure between 1 MPa and 10 MPa for between three minutes and five minutes. Upon completion of the compression cooling process, the basalt fiber core has been fabricated/manufactured.

Figure 6:
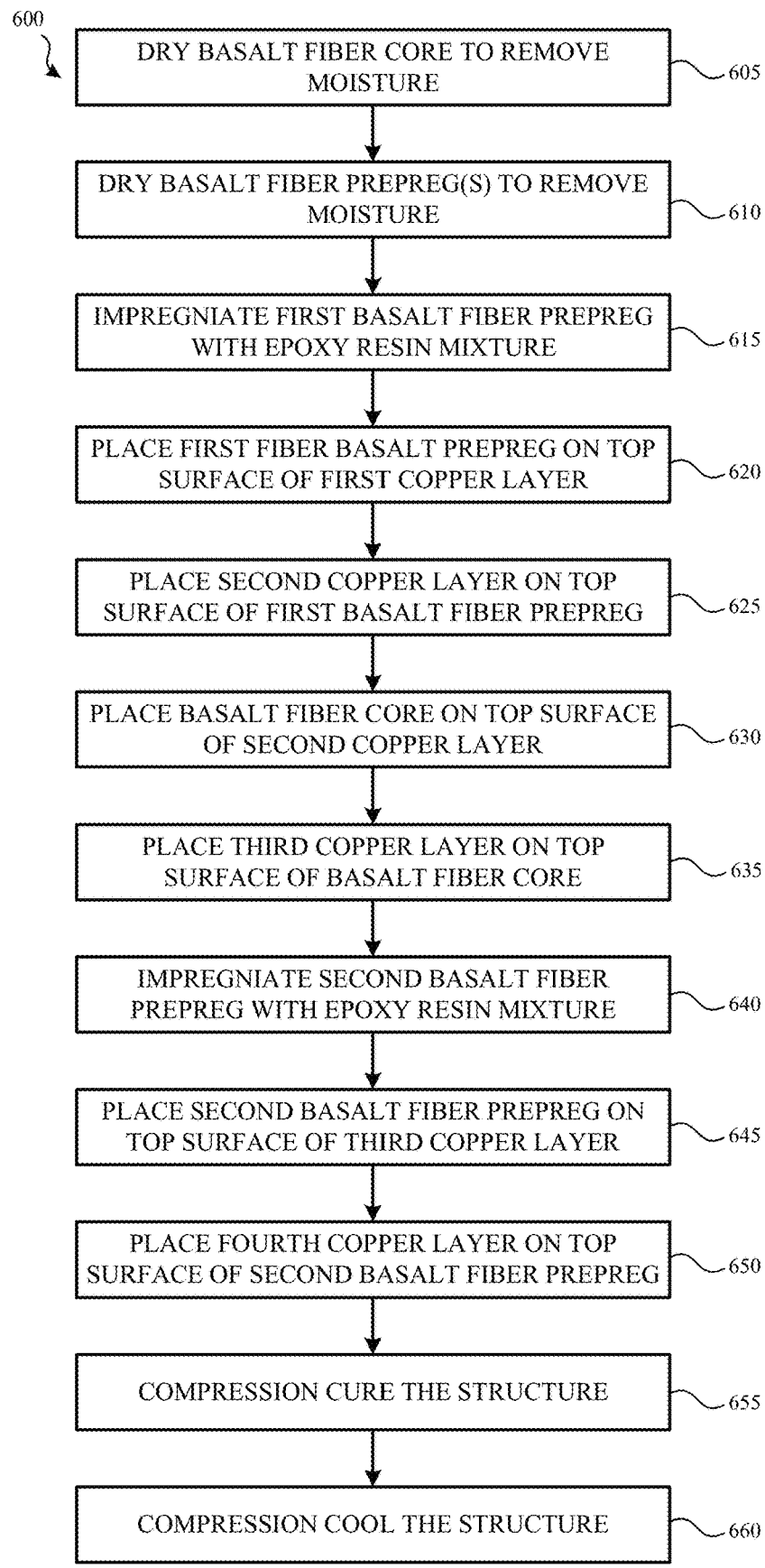
FIG. 6 illustrates a method for fabricating a multi-layer printed circuit board according to an example.

FIG. 6 illustrates a method 600 for fabricating a multi-layer PCB according to an example. In an example, the method 600 may be used to fabricate a multi-layer basalt fiber fabric-based PCB 200 shown and described with respect to FIG. 2. Additionally, the epoxy resin that used in method 600 may be the epoxy resin mixture that was produced using the method 300 shown and described with respect to FIG. 3. The basalt fiber prepreg and/or the basalt fiber core that are used to fabricate the multi-layer basalt fiber fabric-based PCB may be fabricated using the method 400 shown and described with respect to FIG. 4 and/or the method 500 shown and described with respect to FIG. 5.

Method 600 begins when a fabricated basalt fiber core is dried (605) to remove any moisture. Likewise, one or more basalt fiber prepregs are also dried (610) to remove any moisture. In an example, the drying processes includes the various drying processes previously described. In an example, the basalt fiber core and/or the basalt fiber prepregs are dried between thirty minutes to one hour at a temperature between 70° C. to 100° C.

Upon completion of the drying process, a first basalt fiber prepreg is impregnated (615) with an epoxy resin. In an example, the first basalt fiber prepreg is impregnated with the epoxy resin using the various coating/impregnation processes previously described. In an example, the first basalt fiber prepreg is impregnated with the epoxy resin mixture that was produced using the method 300. Impregnating the first basalt fiber prepreg with the epoxy resin helps adhere, attach, bond or otherwise secure copper layers to the first basalt fiber prepreg.

Upon removal of the basalt fiber prepreg from the epoxy resin mixture, the first basalt fiber prepreg is placed (620) on a first copper layer. A second copper layer is then placed (625) on a top surface of the first basalt fiber prepreg. A basalt fiber core is then placed (630) on a top surface of the second copper layer. A third copper layer may then be placed (635) on a top surface of the basalt fiber core.

A second basalt fiber prepreg may then be impregnated (640) with an epoxy resin. In an example, the second basalt fiber prepreg is impregnated with epoxy resin using the various coating/impregnation processes previously described. In an example, the second basalt fiber prepreg is impregnated with the epoxy resin mixture that was produced using the method 300. Impregnating the second basalt fiber prepreg with epoxy resin helps adhere, attach, bond or otherwise secure copper layers to the second basalt fiber prepreg.

Upon removal of the second basalt fiber prepreg from the epoxy resin mixture, the second basalt fiber prepreg is placed (645) on a top surface of the third copper layer. A fourth copper layer is then placed (650) on a top surface of the second basalt fiber prepreg.

The structure (e.g., the first copper layer, the first basalt fiber prepreg, the second copper layer, the basalt fiber core, the third copper layer, the second basalt fiber prepreg and the fourth copper layer) is compression cured (655) using a compression curing process. In an example, the structure is compression cured at a temperature between 170° C. and 175° C., at a pressure between 1 MPa and 10 MPa for between three minutes and five minutes. In an example, an oven and/or hot press equipment are used for the compression curing process.

The structure is then cooled and compressed (660) using a compression cooling process. In an example, the structure is cooled with water and is compressed at a pressure between 1 MPa and 10 MPa for between three minutes and five minutes.

Based on the above, examples of the present disclosure describe a printed circuit board (PCB), comprising: a basalt fiber core comprising: a first prepreg comprising basalt fibers and epoxy resin; a first copper layer coupled to a first surface of the first prepreg; and a second copper layer coupled to a second surface of the first prepreg; a third copper layer coupled to the first copper layer; a fourth copper layer coupled to the second copper layer; a second prepreg coupled to the third copper layer, the second prepreg comprising basalt fibers and epoxy resin; and a third prepreg coupled to the fourth copper layer, the third prepreg comprising basalt fibers and epoxy resin. In an example, the PCB also includes a fifth copper layer coupled to the second prepreg and a sixth copper layer coupled to the third prepreg. In an example, the first copper layer and the second copper layer are coupled to the first surface of the first prepreg and the second surface of the first prepreg during a compression curing process. In an example, the modulus of elasticity of the PCB is between 6.0 gigapascals (GPa) to 9.0 GPa. In an example, the PCB has a coefficient of thermal expansion (CTE) between 12 parts per million per degree Celsius (ppm/° C.) and 18 ppm/° C. in a first axis and a CTE between 15 ppm/° C. and 19 ppm/° C. in a second axis. In an example, the PCB has a density between 1.9 grams per cubic centimeter (g/cm$^3$) and 2.3 g/cm$^3$ and wherein the PCB has a thermal conductivity between 2.5 watts per meter per Kelvin (W/m·K) and 3.2 W/m·K. In an example, the PCB has a dielectric constant at 1 GHz between 4.7 and 5.8.

Other examples describe a method of fabricating a basalt fiber prepreg for a printed circuit board (PCB), comprising: drying a basalt fiber fabric; impregnating the basalt fiber fabric with an epoxy resin; compression curing the basalt fiber fabric and the epoxy resin; and cooling the basalt fiber fabric and the epoxy resin. In an example, drying the basalt fiber fabric comprises drying the basalt fiber fabric at a temperature between 70° C. and 100° C. for between thirty minutes and sixty minutes. In an example, impregnating the basalt fabric with the epoxy resin comprises one or more processes selected from a group of processes, comprising: dip coating, spray coating, slot-die coating, immersion, ultrasonic coating, three-dimensional printing, roller coating, paint brush, electrostatic spraying, and a high volume low pressure (HVLP) spray. In an example, compression curing the basalt fiber fabric comprises compression curing the basalt fiber fabric at a temperature between 170° C. and 175° C. at a pressure between 1 Megapascal (MPa) and 10 MPa for between three minutes and five minutes. In an example, cooling the basalt fiber fabric comprises water cooling the basalt fiber fabric while applying a pressure between 1 Megapascal (MPa) and 10 MPa for between three minutes and five minutes.

Yet other examples describe a method of fabricating a printed circuit board (PCB), comprising: impregnating a first basalt fiber prepreg with epoxy resin; placing the first basalt fiber prepreg on a first copper layer; placing a second copper layer on a top surface of the first basalt fiber prepreg; placing a basalt fiber core on the second copper layer; placing a third copper layer on a top surface of the basalt fiber core; impregnating a second basalt fiber prepreg with epoxy resin; placing the second basalt fiber prepreg on a top surface of the third copper layer; placing a fourth copper layer on a top surface of the second basalt fiber prepreg; and compressing the basalt fiber core, the first basalt fiber prepreg, the second basalt fiber prepreg, the first copper layer, the second copper layer, the third copper layer and the fourth copper layer. In an example, compressing the basalt fiber core, the first basalt fiber prepreg, the second basalt fiber prepreg, the first copper layer, the second copper layer, the third copper layer and the fourth copper layer comprises compressing curing the basalt fiber core, the first basalt fiber prepreg, the second basalt fiber prepreg, the first copper layer, the second copper layer, the third copper layer and the fourth copper layer at a temperature between 170° C. and 175° C. at a pressure between 1 Megapascal (MPa) and 10 MPa for between three minutes and ten minutes. In an example, the method also includes cooling the compressed basalt fiber core, the first basalt fiber prepreg, the second basalt fiber prepreg, the first copper layer, the second copper layer, the third copper layer and the fourth copper layer. In an example, cooling the compressed basalt fiber core, the first basalt fiber prepreg, the second basalt fiber prepreg, the first copper layer, the second copper layer, the third copper layer and the fourth copper layer comprises water cooling the compressed basalt fiber core, the first basalt fiber prepreg, the second basalt fiber prepreg, the first copper layer, the second copper layer, the third copper layer and the fourth copper layer while applying a pressure between 1 Megapascal (MPa) and 10

MPa for between three minutes and five minutes. In an example, fabricating the first basalt fiber prepreg and the second basalt fiber prepreg comprises: drying a basalt fiber fabric; impregnating the basalt fiber fabric with the epoxy resin; compression curing the basalt fiber fabric; and cooling the basalt fiber fabric. In an example, drying the basalt fiber fabric comprises drying the basalt fiber fabric at a temperature between 70° C. and 100° C. for between thirty minutes and sixty minutes. In an example, compression curing the basalt fiber fabric comprises compression curing the basalt fiber fabric at a temperature between 170° C. and 175° C. at a pressure between 1 Megapascal (MPa) and 10 MPa for between three minutes and five minutes. In an example, cooling the basalt fiber fabric comprises water cooling the basalt fiber fabric while applying a pressure between 1 Megapascal (MPa) and 10 MPa for between three minutes and five minutes.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks. Additionally, it is contemplated that the flowcharts and/or aspects of the flowcharts may be combined and/or performed in any order.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A printed circuit board (PCB), comprising:
   a basalt fiber core comprising:
      a first prepreg comprising basalt fibers and epoxy resin;
      a first copper layer coupled to a first surface of the first prepreg; and
      a second copper layer coupled to a second surface of the first prepreg;
   a third copper layer coupled to the first copper layer;
   a fourth copper layer coupled to the second copper layer;
   a second prepreg coupled to the third copper layer, the second prepreg comprising basalt fibers and epoxy resin; and
   a third prepreg coupled to the fourth copper layer, the third prepreg comprising basalt fibers and epoxy resin.

2. The PCB of claim 1, further comprising a fifth copper layer coupled to the second prepreg and a sixth copper layer coupled to the third prepreg.

3. The PCB of claim 1, wherein the first copper layer is coupled to the first surface of the first prepreg and the second copper layer is coupled to the second surface of the first prepreg during a compression curing process.

4. The PCB of claim 1, wherein the PCB has a modulus of elasticity between 6.0 gigapascals (GPa) to 9.0 GPa.

5. The PCB of claim 1, wherein the PCB has a coefficient of thermal expansion (CTE) between 12 parts per million per degree Celsius (ppm/° C.) and 18 ppm/° C. in a first axis and a CTE between 15 ppm/° C. and 19 ppm/° C. in a second axis.

6. The PCB of claim 1, wherein the PCB has a density between 1.9 grams per cubic centimeter (g/cm$^3$) and 2.3 g/cm$^3$ and wherein the PCB has a thermal conductivity between 2.5 watts per meter per Kelvin (W/m·K) and 3.2 W/m·K.

7. The PCB of claim 1, wherein the PCB has a dielectric constant at 1 GHz between 4.7 and 5.8.

8. A printed circuit board (PCB), comprising:
   a core comprising a first prepreg consisting of basalt fibers and epoxy resin positioned between two copper layers;
   a first copper layer coupled to a first surface of the core;
   a second copper layer coupled to a second surface of the core;
   a second prepreg coupled to the first copper layer, the second prepreg consisting of basalt fibers and epoxy resin; and
   a third prepreg coupled to the second copper layer, the third prepreg consisting of basalt fibers and epoxy resin.

9. The PCB of claim 8, further comprising a third copper layer coupled to the second prepreg and a fourth copper layer coupled to the third prepreg.

10. The PCB of claim 8, wherein the PCB has a modulus of elasticity between 6.0 gigapascals (GPa) to 9.0 GPa.

11. The PCB of claim 8, wherein the PCB has a coefficient of thermal expansion (CTE) between 12 parts per million per degree Celsius (ppm/° C.) and 18 ppm/° C. in a first axis and a CTE between 15 ppm/° C. and 19 ppm/° C. in a second axis.

\* \* \* \* \*